United States Patent [19]
Choi

[11] Patent Number: 5,315,555
[45] Date of Patent: May 24, 1994

[54] SENSE AMPLIFIER FOR PERFORMING A HIGH-SPEED SENSING OPERATION

[75] Inventor: Yun-Ho Choi, Suwon, Rep. of Korea

[73] Assignee: SamSung Electronics Co., Ltd., Kyungki, Rep. of Korea

[21] Appl. No.: 785,091

[22] Filed: Oct. 30, 1991

[30] Foreign Application Priority Data

Jun. 19, 1991 [KR] Rep. of Korea .............. 1991-10195

[51] Int. Cl.$^5$ ........................ G11C 5/02; G11C 11/34
[52] U.S. Cl. .................................... 365/207; 365/203; 365/196; 365/230.03
[58] Field of Search ............ 365/208, 203, 207, 230.03

[56] References Cited

U.S. PATENT DOCUMENTS

| | | |
|---|---|---|
| 4,757,215 | 7/1988 | Seo . |
| 4,802,129 | 1/1989 | Hoekstra et al. . |
| 4,813,022 | 3/1989 | Matsui et al. . |
| 4,852,064 | 7/1989 | Kim et al. . |
| 4,916,667 | 4/1990 | Miyabayshi et al. ............ 365/203 |
| 4,939,691 | 7/1990 | Mizukami et al. . |
| 4,996,671 | 2/1991 | Suzuki et al. . |
| 5,021,998 | 6/1991 | Suzuki et al. ............ 365/203.03 |
| 5,043,945 | 8/1991 | Bader . |

FOREIGN PATENT DOCUMENTS

63-94499 4/1988 Japan .

Primary Examiner—Eugene R. LaRoche
Assistant Examiner—Viet Q. Nguyen
Attorney, Agent, or Firm—Robert E. Bushnell

[57] ABSTRACT

A sense amplifier of a semiconductor memory device for performing a high-speed sensing operation. A sensing node SAN and $\overline{SAN}$ of the sense amplifier is precharged to a power voltage level and during a sensing operation, first and second clock signals which are shifted to the power voltage and a ground voltage level, respectively, are applied to the sense amplifier. Thus, a potential difference of the sensing node dependent on a precharge state of the power voltage level is generated quickly and sufficiently. Therefore, the high speed sensing operation and a fast access of data can be performed, thereby improving the performance of the semiconductor memory device.

18 Claims, 3 Drawing Sheets (PRIOR ART)
FIG. 1

SENSE AMPLIFIER FOR PERFORMING A HIGH-SPEED SENSING OPERATION

BACKGROUND OF THE INVENTION

The present invention relates to a dynamic random access memory (DRAM) of a semiconductor memory device, and more particularly to a sense amplifier capable of performing a sensing operation at high speed.

As the more large-scale integration in a semiconductor memory device is recently carried out, a demand for the lower operating voltage or the fast data access speed has increased. In order to meet such a demand, studies on a sensing operation of a bit line playing an important role in the high-speed operation of a memory device, have made most actively progress in field of the memory device. In particular, it is well known fact that the sensing operation of the bit line is dependent on a sensing capability and the operating speed of the sense amplifier.

Figure 1:
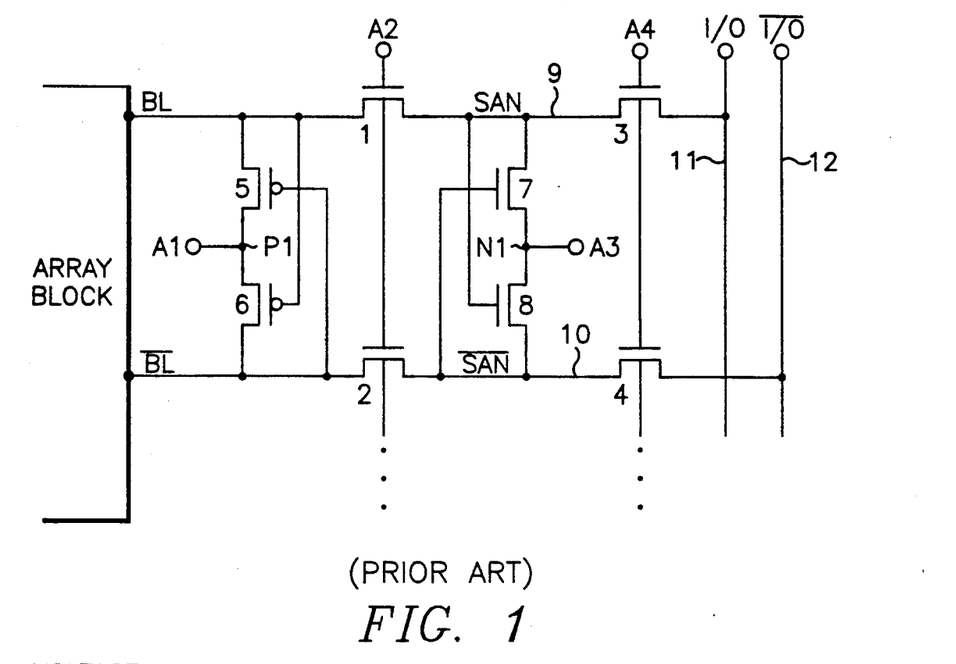
FIG. 1 shows a circuit diagram of a conventional sense amplifier.

FIG. 1 shows a circuit diagram of a conventional sense amplifier. The circuit comprises a pair of bit lines 9 and 10 connected to a memory cell array block, first and second p-type sensing transistors 5 and 6 constituting p-type sense amplifier, first and second n-type sensing transistors 7 and 8 constituting n-type sense amplifier, isolation transistors and 2, input/output transistors 3 and 4, and a pair of common input/output lines 11 and 12. If a memory cell connected to the bit lines 9 and 10 is selected by a word line (not shown), a voltage A2 of a control terminal of the isolation transistors 1 and 2 is raised to the logic "high" of a power voltage level. Also a voltage A4 of a control terminal of the input/output transistors 3 and 4 is raised to the logic "high" after the operation of the sense amplifiers 5 to 8, to thus transfer the output of data conveyed on the bit lines 9 and 10 to an exterior of the sense amplifier circuit.

Figure 2:
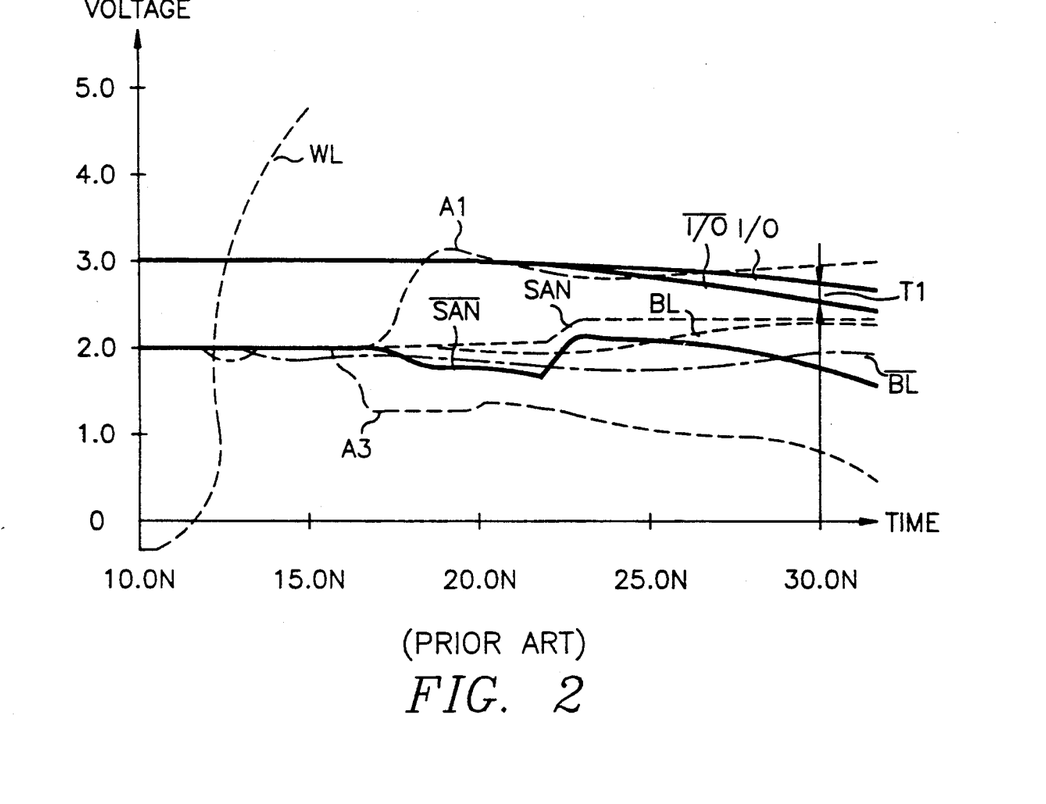
FIG. 2 shows a timing chart illustrating a read operation of FIG. 1.

The read operation of FIG. 1 is described with reference to a timing chart in FIG. 2. It should be noted that the bit lines 9 and 10 are precharged to a $V_{cc}/2$ level before the memory cell is selected, and a node P1 of a common terminal in the p-type sense amplifier and a node N1 of a common terminal in the n-type sense amplifier are also precharged to the $V_{cc}/2$ level by the voltages A1 and A3 of the control terminals, respectively. In this case, the voltages A1 and A3 of the control terminals are power sources supplying a potential of the $V_{cc}/2$ level. However, when the memory cell is selected, the voltages A1 and A3 of the control terminals respectively provide a power voltage $V_{cc}$ and a ground voltage $V_{ss}$ level, by a row address strobe $\overline{RAS}$ signal. Then, the voltage level of the node N1 is shifted from the $V_{cc}/2$ level to the ground voltage level, and the n-type sense amplifier drops the bit line close to the ground voltage level to the ground voltage level. After a given time is passed, the p-type sense amplifier operates and raises the bit line close to the power voltage level to the power voltage level. However, since sensing nodes SAN and $\overline{SAN}$ are initially precharged to the $V_{cc}/2$ level, the charge sharing between the bit lines connected to both sides of the isolation transistors 1 and 2 is considerably delayed, and the variation speed of a potential difference between the bit lines 9 and 10 becomes extremely slow, because of the loading of the bit lines. This leads to a delay of time, the time being that the input/output transistors 3 and 4 are turned on when the potential difference between the bit lines 9 and 10 is approximately 1 V, thereby, the access time of the data becomes slow.

Figure 3:
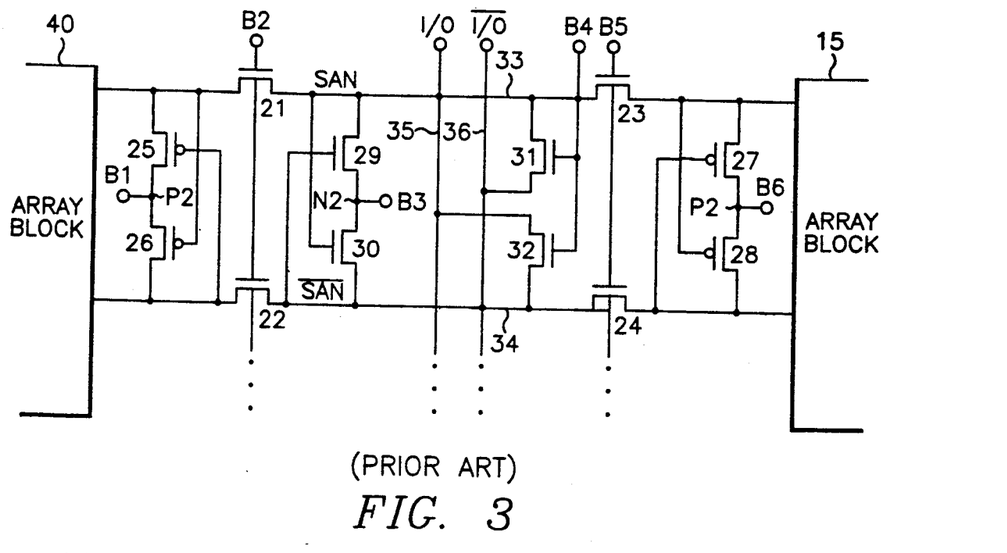
FIG. 3 shows a circuit diagram of another conventional sense amplifier.

FIG. 3 shows a circuit diagram of another conventional sense amplifier. The circuit is constructed so that array blocks 40 and 45 neighboring to each other share an n-type sense amplifier, input/output transistors 31 and 32, and common input/output lines 35 and 36. Thus, when the array block 40 is selected, a voltage B5 of a control terminal of isolation transistors 23 and 24 is shifted to 0 V, thereby isolating the array block 45 from the shared components. In the same way, when the right array block 45 is selected, a voltage B2 of a control terminal of the isolation transistors 21 and 22 is shifted to 0 V. The circuit of FIG. 3 is greatly improved in view of the degree of integration, in comparison with the circuit of FIG. 1. However, it still has a disadvantage in that the high speed sensing operation is difficult since the sensing operation of the bit line and the transferring operation of data to the common input/output lines 35 and 36, are performed in the same method as that of the circuit of FIG. 1.

SUMMARY OF THE INVENTION

It is therefore an object of the present invention to provide a sense amplifier circuit capable of performing a high-speed sensing operation.

In accordance with the present invention, a sense amplifier for use in a semiconductor memory device, the semiconductor memory device having first and second memory blocks including a plurality of memory cells, a pair of sensing lines commonly connected to the first and second memory array blocks, through a pair of first isolation transistors and a pair of second isolation transistors isolating the first and second memory array blocks from the sensing lines when a given memory cell is selected, and a pair of common input/output lines for transferring input/output data to an exterior of a semiconductor memory chip, and data input/output transistors connected between the sensing lines and the common input/output lines, comprises a precharge means connected to the sensing lines positioned between the first and second isolation transistors, for precharging voltage of the sensing lines to a power voltage level by a given control signal, and a sensing means connected to the sensing lines, for amplifying a potential difference between the sensing lines. The precharging means is operated only when the control signal is active state, and the sensing means is operated only when the control signal is non-active state.

BRIEF DESCRIPTION OF THE DRAWINGS

The advantages and features of the present invention will be more apparent from the detailed description hereunder, with the reference to the attached drawings, in which.

DETAILED DESCRIPTION OF THE PREFERRED EMBODIMENT

Figure 4:
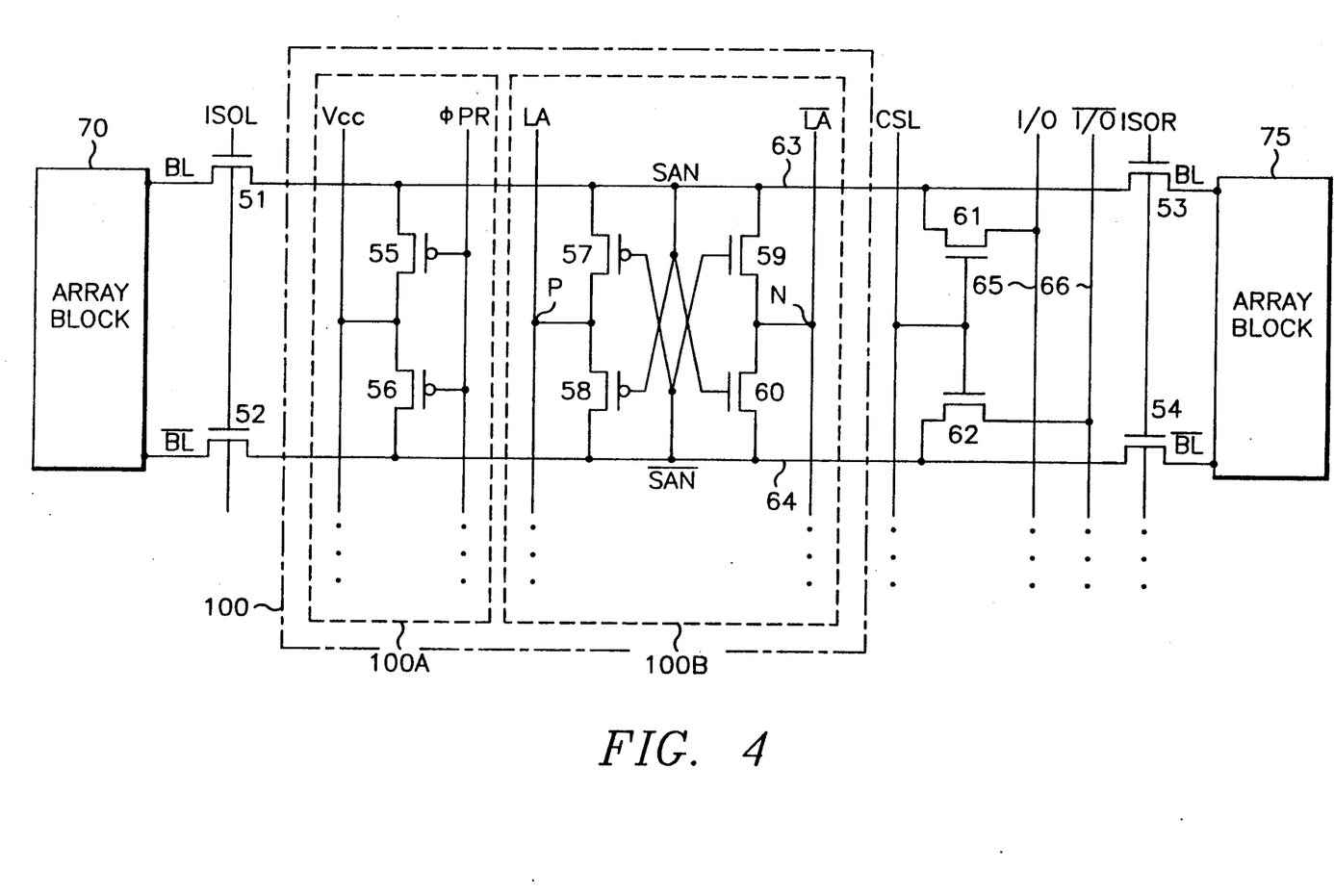
FIG. 4 shows a circuit diagram of a sense amplifier according to the present invention.

In the following description, in order to avoid the confusion between the lines up to each array block from the isolation transistors 51 to 54 and the lines 63 and 64 positioned between isolation transistors 51 and 52, and 53 and 54, the former is designated as the bit line and the latter is denoted as the sensing line. Referring to FIG. 4, the reference numeral 100 designates a sense amplifier block according to the present invention. Since isolation transistors 51 to 54, input/output transistors 61 and 62, common input/output lines 65 and 66 and array blocks, etc., are generally known constructive elements, the description for function thereof is omitted. The sense amplifier block 100 is largely divided into a precharge means 100A and a sensing means 100B. The precharge means 100A includes a first load transistor 55 having a gate connected to receive a precharge signal $\phi_{PR}$ and having a channel connected between a power voltage terminal and a first sensing line 63, and a second load transistor 56 having a gate connected to receive the precharge signal $\phi_{PR}$ and a channel connected between the power voltage terminal and a second sensing line 64. In this case, it should be noted that the precharge signal $\phi_{PR}$ is generated from a row address strobe signal $\overline{RAS}$, and when the row address strobe signal $\overline{RAS}$ is generated, the precharge signal $\phi_{PR}$ is the logic "high" level. The sensing means 100B is comprised of first and second p-type sensing transistors 57 and 58 and first and second n-type sensing transistors 59 and 60. The first p-type sensing transistor 57 has a channel connected between a node P receiving a first latch signal LA and the first sensing line 63, and a gate connected to the second sensing line 64. The second p-type sensing transistor 58 has a channel connected between the node P and the second sensing line 64, and a gate connected to the first sensing line 63. A channel of the first n-type sensing transistor 59 is connected between a node N receiving a second latch signal $\overline{LA}$ and the first sensing line 63, and a gate thereof is connected to the second sensing line 64. A channel of the second n-type sensing transistor 60 is connected between the node N and the second sensing line 64, and a gate thereof is connected to the first sensing line 63. The first and second p-type sensing transistors 57 and 58 constitute a p-type sense amplifier, and the first and second n-type sensing transistors 59 and 60 constitute an n-type sense amplifier. As shown, a first sensing node SAN on the first sensing line 63 and a second sensing node $\overline{SAN}$ on the second sensing line 64, sense a potential variation of each sensing line. Moreover, it should be noted that the first and second sensing nodes SAN and $\overline{SAN}$ are precharged to the potential of a power voltage level, by the first and second load transistors 55 and 56. Furthermore, the first and second latch signals LA and $\overline{LA}$, as a load signal of the power voltage level, are applied to the nodes P and N, precharging the potential of the nodes P and N, respectively, to the potential of the power voltage level. During the sensing operation of the sensing line, the first latch signal LA maintains the power voltage level and the second latch signal $\overline{LA}$ is shifted to a ground voltage level.

Figure 5:
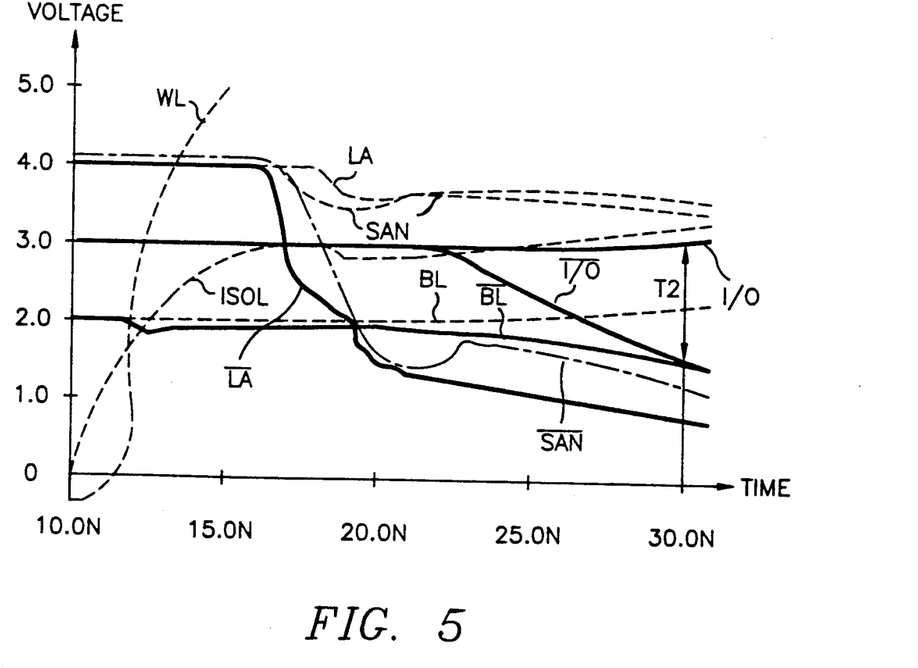
FIG. 5 shows a timing chart illustrating a read operation of FIG. 4.

The operating characteristic of FIG. 4 is hereafter described with reference to FIG. 5. Moreover, it will be readily appreciated that the first and second bit line BL and $\overline{BL}$ are precharged to a $V_{cc}/2$ level, the first and second sensing nodes SAN and $\overline{SAN}$ are precharged to the power voltage level $V_{cc}$, and the isolation transistors 51 to 54 are all turned off.

Data of a memory cell is transferred to the bit line connected to the memory cell by the selection of a word line, and a potential difference between the first and second bit lines BL and $\overline{BL}$ is generated. For example, let us assume that the memory cell in the array block 70 is selected. Here, if the logic "high" is applied to a control terminal ISOL of the isolation transistors 51 and 52, the isolation transistor 51 or 52 connecting the bit line of the logic "low" level out of the first and second bit lines BL and $\overline{BL}$, to the sensing node SAN or $\overline{SAN}$ is first turned on. Therefore, the potential of the sensing node connected to the bit line of the logic "low" level comes to lower, since the potential of the sensing node is transferred to the bit line of the logic "low" level. For example, if the potential of the second bit line $\overline{BL}$, is lowered, the isolation transistor 52 is turned on prior to the turning on of the isolation transistor 51, and the charge sharing with the second sensing node $\overline{SAN}$ is generated. Then, since the potential of the second sensing node $\overline{SAN}$ comes to lower and the first sensing node SAN maintains its potential level, the potential of the second sensing node $\overline{SAM}$ begins to discharge, through the node N shifted to the ground voltage. Thus, according as the potential of the second sensing node $\overline{SAN}$ is gradually lowered, the first sensing transistor 59 of the n-type sense amplifier is turned off by degrees and the potential of the first sensing node SAN comes to latch. For example, when reading data "0" of the cell, the data "0" is transferred to the bit line precharged to $V_{cc}/2$ level and then is again transferred to the sensing node through the isolation transistor. At this time, assuming that there is no any potential variation, this can be expressed as "$V_{cc}/2 \cdot C_S \approx (V_{cc} - V_f) \cdot C_{SN}$". Wherein $C_S$ is capacitance of the memory cell and $C_{SN}$ is capacitance of the sensing node. The $V_F$ is a final potential level of the sensing node and is represented as "$V_F = V_{cc} - (C_S \cdot V_{cc})/2C_{SN}$". Therefore, if $V_{cc}$ is 5 V and $C_{SN}$ is $3C_S$, the $V_F$ becomes 4.17 V and the potential difference of 0.83 V is generated in the sensing node. The above expression is when the control voltage of the isolation transistor is "$V_{cc}/2 + V_{TN}$", $V_{TN}$ being a threshold voltage of the isolation transistor. Accordingly, if the control voltage is higher than "$V_{cc}/2 + V_{TN}$", the isolation transistor 51 which is previously turned off is turned on, to thus start the charge sharing with the first sensing node SAN which does not perform the charge sharing. The interval of the time that the isolation transistors 51 and 52 are turned on, can adjust by controlling a rising slope of the control voltage of the isolation transistors 51 and 52 as shown in FIG. 5. However, since the potential difference between the first sensing node SAN and the second sensing node $\overline{SAN}$ is previously amplified, the potential of the power voltage level is latched in the first sensing node SAN, and the potential of the lower level than the power voltage level is latched in the second sensing node $\overline{SAN}$, the potential difference between the first and second sensing nodes SAN and $\overline{SAN}$ is continuously maintained. Accordingly, the potential of the second sensing node $\overline{SAN}$ is discharged through the node N of the ground voltage level, turning on the first p-type sensing transistor 57 of the p-type sense amplifier and turning off the first n-type sensing transistor 59 of the n-type sense amplifier, respectively. Also the potential of the first sensing node SAN continuously maintains the potential of the power voltage level through the node P of the power voltage level. Since the above sensing operation is performed at high speed and the potential difference between the first and second sensing nodes SAN and $\overline{SAN}$ is greatly increased, the sufficient potential difference is directly transferred to the common input/output lines 65 and 66 through the input/output transistors 61 and 62. Thus, the transfer of data to the exterior of the semiconductor memory chip is performed at high speed. This will be readily appreciated, if comparing an interval T2 of FIG. 5 with the interval T1 of FIG. 2. That is, since at the interval T1, there is little difference between voltages of the common input/output lines I/O and $\overline{I/O}$, it is difficult to perform the access operation of the desired data at high speed, but since at the interval T2, the difference between the voltages of the common input/output lines I/O and $\overline{I/O}$ is sufficiently large, the access operation of the data is performed at high speed.

As described above, the sense amplifier according to the present invention has a simple layout. Because the sensing operation is sufficiently performed at high speed, the sense amplifier according to the present invention is effective in a memory device using the low power voltage. Accordingly, the memory device having high operating speed, though the loading of the bit lines is large, such as a highly integrated dynamic RAM over 16 mega byte, can be realized.

While the present invention has been particularly shown and described with reference to the preferred embodiment thereof, it will be understood by those skilled in the art that foregoing and other changes in form and details may be made without departing from the spirit and scope of the present invention

What is claimed is:

1. A sense amplifier for a semiconductor memory device, comprising:

first and second memory array blocks each having a plurality of memory cells;

a pair of sensing lines each commonly connected to said first and second memory array blocks;

a pair of first and second isolation transistors for isolating said first and second memory array blocks from said sensing lines when a given memory cell is selected;

a pair of common input/output lines for transferring input/output data to an exterior of said semiconductor memory device;

data input/output transistors connected between said sensing lines and said common input/output lines, for enabling access operation of said semiconductor memory device;

precharge means connected to said sensing lines and coupled to receive a control signal, for precharging a voltage of said sensing lines to a power voltage amplitude in dependence upon said control signal; and sensing means connected to said sensing lines, for amplifying a potential difference between said sensing lines in dependence on reception of a first latching signal exhibiting said power voltage amplitude before a sensing operation and reception of a second latching signal exhibiting said power voltage amplitude before said sensing operation and exhibiting a reference voltage different from said power voltage amplitude during said sensing operation.

2. A sense amplifier as claimed in claim 1, wherein said precharge means comprises:

a first transistor comprising a first electrode of a principal electrically conducting channel coupled to a first line of said sensing lines and a second electrode of said principal electrically conducting channel coupled to a first node;

a second transistor comprising a first electrode of a principal electrically conducting channel coupled to said first node and a second electrode of said principal electrically conducting channel coupled to a second line of said sensing lines;

a third transistor comprising a first electrode of a principal electrically conducting channel coupled to said first line of said sensing lines and a second electrode of said principal electrically conducting channel coupled to a second node;

a fourth transistor comprising a first electrode of a principal electrically conducting channel coupled to said second node and a second electrode of said principal electrically conducting channel coupled to said second line of said sensing lines;

control electrodes of said first transistor and said third transistor being coupled to said second line of said sensing lines; and control electrodes of said second transistor and said fourth transistor being coupled to said first line of said sensing lines.

3. A sense amplifier as claimed in claim 1, wherein said precharge means comprises:

a first load transistor having a gate coupled to receive said control signal, and a channel connected between a power voltage terminal and a first one of said sensing lines; and a second load transistor having a gate coupled to receive said control signal, and a channel connected between said power voltage terminal and a second one of said sensing lines.

4. A sense amplifier as claimed in claim 1, wherein said sensing means comprises:

a first p-type sensing transistor having a channel connected between a first node for receiving said first latching signal and a first one of said sensing lines, and a gate connected to a second one of said sensing lines;

a second p-type sensing transistor having a channel connected between said first node and said second one of said sensing lines, and a gate connected to said first one of said sensing lines;

a first n-type sensing transistor having a channel connected between a second node for receiving said second latching signal and said first one of said sensing lines, and a gate connected to said second one of said sensing lines; and a second n-type transistor having a channel connected between said second node and said second one of said sensing lines, and a gate connected to said first one of said sensing lines.

5. A sense amplifier as claimed in claim 1, further comprised of said precharge means precharging the voltage of said sensing lines to said power voltage amplitude only when said control signal is in an active state, and said sensing means amplifying the potential difference between the sensing lines only when said control signal is in an active state.

6. A semiconductor memory device, comprising
   a plurality of memory cells;
   a pair of sensing lines coupled to a selected memory cell from said plurality of memory cells through a pair of isolation transistors;

precharging means connected to said sensing lines, for precharging said sensing lines; and sense amplifier means being operable by a pair of clock signals applied with a same logic level during a first state, and a complimentary logic level during a second state, for sensing and amplifying a potential difference between said first and second sensing lines to enable access to data stored in said selected memory cell, said sense amplifier comprising:

first sensing node means connected to said first sensing line, for maintaining a potential of said first sensing line at a power voltage level during said first and second state; and second sensing node means connected to said second sensing line, for maintaining the potential of said second sensing line at said power voltage level during said first state, and for maintaining the potential of said second sensing line at a level lower than said power voltage level during said second state.

7. A sense amplifier as claimed in claim 6, wherein said first and second states are respectively representative of a selection and a non-selection of said sensing lines.

8. A semiconductor memory device, comprising:
a first array of memory cells;
a second array of memory cells;
a pair of bit lines interposed between said first and second arrays of memory cells, for connecting selected memory cells of said first array with corresponding selected memory cells of said second array;
a pair of first and a pair of second isolating transistors, each pair connected to the pair of bit lines respectively, for isolating memory cells of said first and second arrays from said bit lines in dependence upon a sensing operation;
a pair of data input/output transistors respectively connected to the pair of bit lines, for selectively transferring data from and to the bit lines;
precharging means interposed between the pair of said bit lines, for precharging said bit lines to a precharge voltage in dependence upon a precharge clock signal, said precharging means precharging said bit lines to said precharge voltage only when said precharge clock signal is in an active state; and
sense amplifier means for amplifying a potential difference between said bit lines in dependence upon reception of a first latching signal exhibiting said precharge voltage before said sensing operation and reception of a second latching signal exhibiting said precharge voltage before said sensing operation and exhibiting a ground voltage during said sensing operation, said sense amplifier means amplifying said potential difference between said bit lines only when said precharge clock signal is in an inactive state.

9. The semiconductor memory device of claim 8, wherein said sense amplifier comprises:
a first p-type transistor having a first electrode of a principal electrically conducting channel coupled to a first bit line of said pair of bit lines and a second electrode of said principal electrically conducting channel coupled to a first node;
a second p-type transistor having a first electrode of a principal electrically conducting channel coupled to said first node and a second electrode of said principal electrically conducting channel coupled to a second bit line of said pair of bit lines;
a first n-type transistor having a first electrode of a principal electrically conducting channel coupled to said first bit line and a second electrode of said principal electrically conducting channel coupled to a second node;
a second n-type transistor having a first electrode of a principal electrically conducting channel coupled to said second node and a second electrode of said principal electrically conducting channel coupled to said second bit line;
control electrodes of said first p-type transistor and said first n-type transistor being coupled to said second bit line; and
control electrodes of said second p-type transistor and said second n-type transistor being coupled to said first bit line.

10. The semiconductor memory device of claim 9, further comprised of first and second latching means for conducting said latching signals, said first latching means being coupled to said first node and said second latching means being coupled to said second node.

11. The semiconductor memory device of claim 8, wherein said sense amplifier comprises:
a first p-type transistor having a first electrode of a principal electrically conducting channel coupled to a first bit line of said pair of bit lines and a second electrode of said principal electrically conducting channel coupled to a first node;
a second p-type transistor having a first electrode of a principal electrically conducting channel coupled to said first node and a second electrode of said principal electrically conducting channel coupled to a second bit line of said pair of bit lines;
a first n-type transistor having a first electrode of a principal electrically conducting channel coupled to said first bit line and a second electrode of said principal electrically conducting channel coupled to a second node;
a second n-type transistor having a first electrode of a principal electrically conducting channel coupled to said second node and a second electrode of said principal electrically conducting channel coupled to said second bit line;
control electrodes of said first p-type transistor and said first n-type transistor being coupled to said second bit line; and
control electrodes of said second p-type transistor and said second n-type transistor being coupled to said first bit line.

12. The semiconductor memory device of claim 11, further comprised of first and second latching means for conducting said latching signals, said first latching means being coupled to said first node and said second latching means being coupled to said second node.

13. The semiconductor memory device of claim 8, wherein said precharging means comprises:
a first transistor having a first electrode of a principal electrically conducting channel coupled to a first bit line of said pair of bit lines;
a second transistor having a first electrode of a principal electrically conducting channel forming a first node with a second electrode of said principal electrically conducting channel of said first transistor, and having a second electrode of said principally electrically conducting channel coupled to a second bit line of said pair of bit lines;

means coupled to said first node, for conducting said precharge voltage; and means coupled to control electrodes of said first and second transistors, for conducting said precharge clock signal.

14. The semiconductor memory device of claim 9, wherein said precharging means comprises:

a first precharging transistor having a first electrode of a principal electrically conducting channel coupled to a first bit line of said pair of bit lines;

a second precharging transistor having a first electrode of a principal electrically conducting channel forming a first node with a second electrode of said principal electrically conducting channel of said first precharging transistor, and having a second electrode of said principally electrically conducting channel coupled to a second bit line of said pair of bit lines;

means coupled to said third node, for conducting said precharge voltage amplitude; and means coupled to control electrodes of said first precharging transistor and said second precharging transistor, for conducting said precharge clock signal.

15. The semiconductor memory device of claim 10, wherein said precharging means comprises:

a first precharging transistor having a first electrode of a principal electrically conducting channel coupled to a first bit line of said pair of bit lines;

a second precharging transistor having a first electrode of a principal electrically conducting channel forming a first node with a second electrode of said principal electrically conducting channel of said first precharging transistor, and having a second electrode of said principally electrically conducting channel coupled to a second bit line of said pair of bit lines;

means coupled to said third node, for conducting said precharge voltage; and means coupled to control electrodes of said first precharging transistor and said second precharging transistor, for conducting said precharge clock signal.

16. The semiconductor memory device as claimed in claim 8, wherein said sense amplifier means comprises:

a pair of p-type transistors serially interposed between said bit line pair having common channels coupled to receive said first latching signal, and control electrodes respectively connected in a criss-cross pattern with lines; and a pair of n-type transistors serially interposed between said bit line pair having common channels coupled to receive said second latching signal, and control electrodes respectively connected in a criss-cross pattern with said pair of bit lines.

17. A method for precharging a pair of bit lines interposed between first and second memory array blocks in a semiconductor memory device having a pair of first and second isolation transistors isolating said first and second memory array blocks from said bit lines when memory cells are selected, comprising the steps of:

precharging said bit lines to a first reference voltage in dependence upon a precharge signal;

maintaining a first one of said bit lines at said first reference voltage in dependence upon a first latching signal before a sensing operation;

maintaining a second one of said bit lines at a second reference voltage lower than said first reference voltage in dependence upon a second latching signal during said sensing operation, said second latching signal being complementary to said first latching signal;

conducting said sensing operation to sense a potential difference between the first and second ones of said bit lines; and amplifying and maintaining the potential difference between said bit lines for enabling access to data stored in the selected memory cells.

18. The method for precharging a pair of bit lines as claimed in claim 17, wherein said first reference voltage exhibits a power voltage amplitude, and said second reference voltage exhibits a ground voltage amplitude.

* * * * *

UNITED STATES PATENT AND TRADEMARK OFFICE
CERTIFICATE OF CORRECTION

PATENT NO. : 5,315,555
DATED : 24 May 1994
INVENTOR(S) : Yun-Ho CHOI

It is certified that error appears in the above-indentified patent and that said Letters Patent is hereby corrected as shown below:

Column 1,   line 27, after "transistors", insert --1--.

Column 5,   claim 1, line 60, change "on" to --upon--.

Column 6,   claim 6, line 64, after "comprising", insert --:--.

Signed and Sealed this

Fourth Day of July, 1995

Attest:

BRUCE LEHMAN

Attesting Officer      Commissioner of Patents and Trademarks

UNITED STATES PATENT AND TRADEMARK OFFICE
CERTIFICATE OF CORRECTION

PATENT NO.   : 5,315,555
DATED        : May 24, 1994
INVENTOR(S)  : Yun-Ho Choi

It is certified that error appears in the above-indentified patent and that said Letters Patent is hereby corrected as shown below:

Column 1,    line 27, after "transistors", insert --1--.

IN THE CLAIMS

Column 5,    claim 1, line 60, change "on" to --upon--.

Column 6,    claim 6, line 64, after "comprising", insert --:--.

Column 10,   claim 16, line 9, after "with", insert --said pair of bit --.

Signed and Sealed this

Seventh Day of November, 1995

Attest:

BRUCE LEHMAN

Attesting Officer          Commissioner of Patents and Trademarks